(12) United States Patent
Gudem et al.

(10) Patent No.: US 9,014,648 B2
(45) Date of Patent: Apr. 21, 2015

(54) DIVERSITY RECEIVER WITH SHARED LOCAL OSCILLATOR SIGNAL IN DIVERSITY MODE

(71) Applicant: QUALCOMM Incorporated, San Diego, CA (US)

(72) Inventors: Prasad Srinivasa Siva Gudem, San Diego, CA (US); Li Liu, San Diego, CA (US); Frederic Bossu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 52 days.

(21) Appl. No.: 13/725,228

(22) Filed: Dec. 21, 2012

(65) Prior Publication Data

US 2014/0179253 A1 Jun. 26, 2014

(51) Int. Cl.
| | |
|---|---|
| H04B 17/02 | (2006.01) |
| H03D 7/14 | (2006.01) |
| H04B 1/00 | (2006.01) |
| H04B 7/08 | (2006.01) |

(52) U.S. Cl.
CPC ............. *H03D 7/1466* (2013.01); *H04B 1/005* (2013.01); *H04B 1/0064* (2013.01); *H04B 7/0871* (2013.01)

(58) Field of Classification Search
USPC .......................... 455/132–137, 140–141, 147
See application file for complete search history.

(56) References Cited

U.S. PATENT DOCUMENTS

| | | | |
|---|---|---|---|
| 8,498,594 B2 * | 7/2013 | Rueckriem | 455/140 |
| 2006/0166638 A1 | 7/2006 | Iwaida | |
| 2012/0214435 A1 * | 8/2012 | Javor et al. | 455/141 |

FOREIGN PATENT DOCUMENTS

| | | |
|---|---|---|
| EP | 1213887 A1 | 6/2002 |
| EP | 1968211 A1 | 9/2008 |
| WO | 2008111146 A1 | 9/2008 |

OTHER PUBLICATIONS

International Search Report and Written Opinion—PCT/US2013/077080—ISA/EPO—Apr. 4, 2014.

\* cited by examiner

*Primary Examiner* — Christian Hannon
(74) *Attorney, Agent, or Firm* — Kenyon S. Jenckes

(57) ABSTRACT

A multi-mode receiver is disclosed that is reconfigurable to share a local oscillator signal in diversity mode to save power consumption. In an exemplary embodiment, an apparatus includes a primary receiver having a primary mixer configured to down-convert a primary signal and a secondary mixer configured to down-convert a secondary signal in carrier aggregation mode. The apparatus also includes a supplemental mixer that uses a shared primary local oscillator (LO) signal generated by a shared primary frequency synthesizer in diversity mode to reduce power consumption. The apparatus further includes a controller configured to disable the secondary mixer and to enable the supplemental mixer to down-convert the secondary signal when operating in the diversity mode.

7 Claims, 6 Drawing Sheets

US 9,014,648 B2

DIVERSITY RECEIVER WITH SHARED LOCAL OSCILLATOR SIGNAL IN DIVERSITY MODE

BACKGROUND

1. Field

The present application relates generally to the operation and design of analog front ends, and more particularly, to the operation and design of diversity receivers.

2. Background

A conventional diversity receiver comprises a primary receiver and a secondary receiver. The primary and second receivers can be operated in one of several operating modes. In a diversity mode of operation, an oscillator signal generated by the primary receiver's frequency synthesizer is transmitted to the secondary receiver to drive the secondary receiver's mixer. Thus, both the primary and secondary mixers utilize the oscillator signal generated by the primary receiver's frequency synthesizer. Substantial power is utilized to transmit or distribute the primary receiver's oscillator signal over a long transmission path to the secondary receiver. It is therefore desirable to have a mechanism to utilize the primary oscillator signal to down-convert a signal received by the secondary receiver while reducing any increase in power consumption resulting from distribution of the primary oscillator signal.

Accordingly, a diversity receiver is provided that utilizes a shared primary local oscillator (LO) signal to reduce power consumption when operating in diversity mode.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
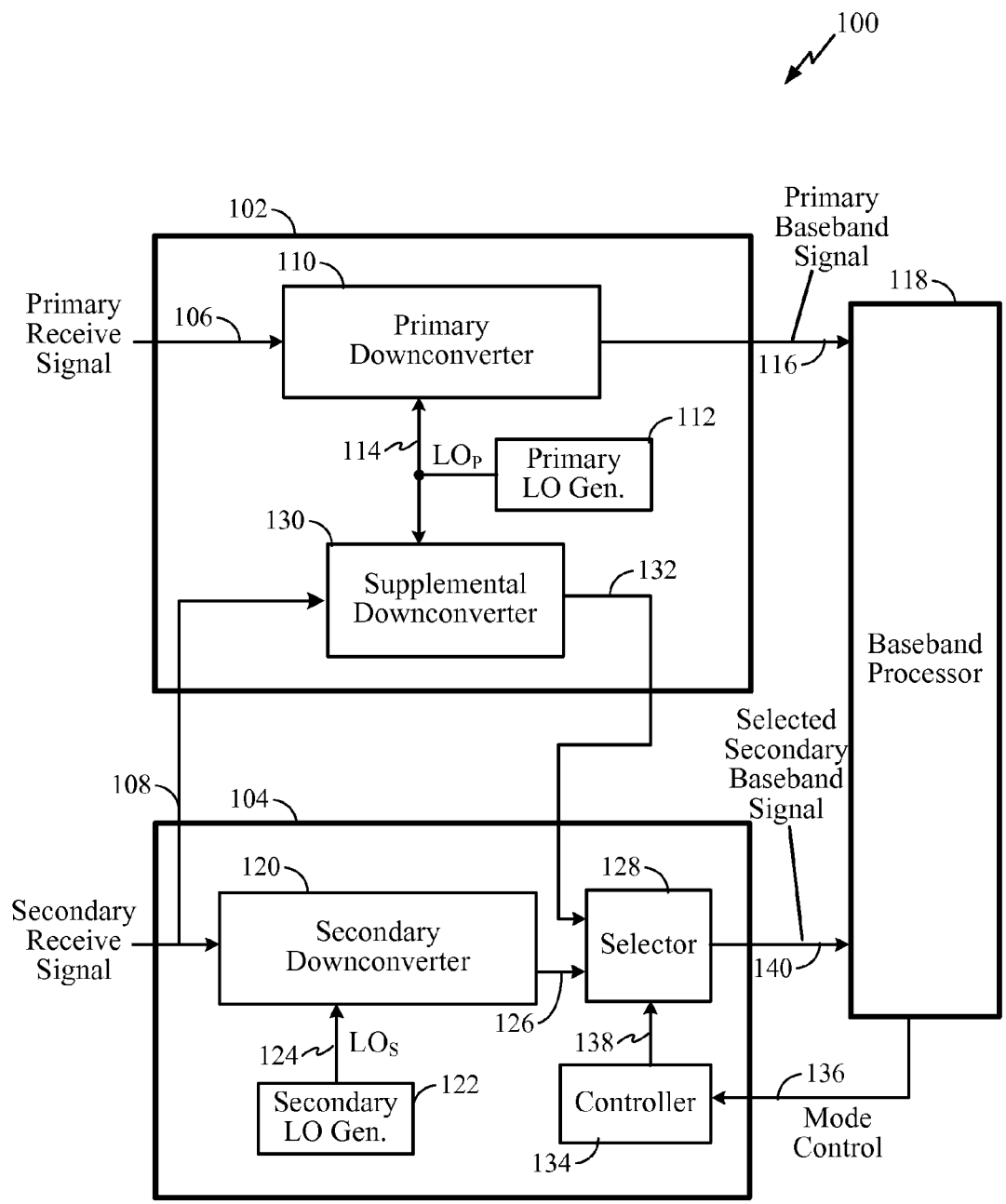
FIG. 1 shows an exemplary embodiment of a novel diversity receiver having a shared primary local oscillator signal for reduced power consumption.

FIG. 1 shows an exemplary embodiment of a novel diversity receiver 100 for use in a wireless device. The diversity receiver 100 comprises a primary receiver 102 to receive a primary receive signal 106 and a secondary receiver 104 to receive a secondary receive signal 108. The primary receiver 102 comprises a primary downconverter 110 and a primary LO generator 112 that generates a primary $LO_P$ signal 114. During operation, the primary downconverter 110 down-converts the primary receive signal 106 using the primary $LO_P$ 114 to generate a primary baseband signal 116 that is input to a baseband processor 118.

The secondary receiver 104 comprises a secondary downconverter 120 and a secondary LO generator 122 that generates a secondary $LO_S$ signal 124. During operation, the secondary downconverter 120 down-converts the secondary received signal 108 using the secondary $LO_S$ signal 124 to generate a secondary baseband signal 126 that is input to a selector 128.

The primary receiver 102 also comprises a supplemental downconverter 130. The supplemental downconverter 130 receives the secondary receive signal 108 and down-converts this signal using the primary $LO_P$ signal 114 to generate a supplemental secondary baseband signal 132 that also is input to the selector 128. A controller 134 receives a mode control signal 136 from the baseband processor 118 and generates a select signal 138 that controls the selector 128 to select one of its inputs to pass to its output as a selected secondary baseband signal 140. For example, the selector 128 may pass the secondary baseband signal 126 or the supplemental secondary baseband signal 132 to its output as the selected secondary baseband signal 140 based on the state of the select signal 138.

The diversity receiver 100 provides multiple operating modes to allow a variety of signals to be received and processed. For example, at least the following three operating modes are supported by the diversity receiver 100.

1. Single receive mode—Only primary receiver 102 is activated to generate the primary baseband signal 116 using the primary $LO_P$ signal 114.
2. Carrier aggregation mode—The primary receiver 102 is activated to generate the primary baseband signal 116 using the primary $LO_P$ signal 114 and the secondary receiver 104 is activated to generate the secondary baseband signal 126 using the secondary $LO_S$ signal 124. The secondary baseband signal 126 is passed to the baseband processor 118 as the selected secondary baseband signal 140.
3. Diversity mode—The primary receiver 102 is activated to generate the primary baseband signal 116 using the primary $LO_P$ signal 114 and supplemental downconverter 130 is activated to generate the supplemental secondary baseband signal 132 using the primary $LO_P$ signal 114. The supplemental secondary baseband signal 132 is passed to the baseband processor 118 as the selected secondary baseband signal 140.

When operating in diversity mode (mode 3 above), the primary $LO_P$ signal 114 is shared between the primary downconverter 110 and the supplemental downconverter 130. The supplemental downconverter 130 then generates the supplemental secondary baseband signal 132 that is input to the baseband processor 118. This configuration results in reduce power consumption when compared to conventional receivers that transmit the primary $LO_P$ signal 114 to the secondary receiver 104 for use by the secondary downconverter 120. Thus, the novel diversity receiver 100 provides at least the following advantages over conventional receivers.

1. Power savings from sharing the primary $LO_P$ signal 114 with the supplemental downconverter 130 during diversity mode.
2. Power savings from disabling selected functions of the secondary receiver not utilized during diversity mode.
3. Improved noise performance by reducing the signal path of primary $LO_P$ signal 114 during diversity mode.

Accordingly, in various exemplary embodiments described in greater detail below, a novel diversity receiver is disclosed herein that is configured to address the problems associated with conventional diversity receivers to reduce power consumption and improve performance.

Figure 2:
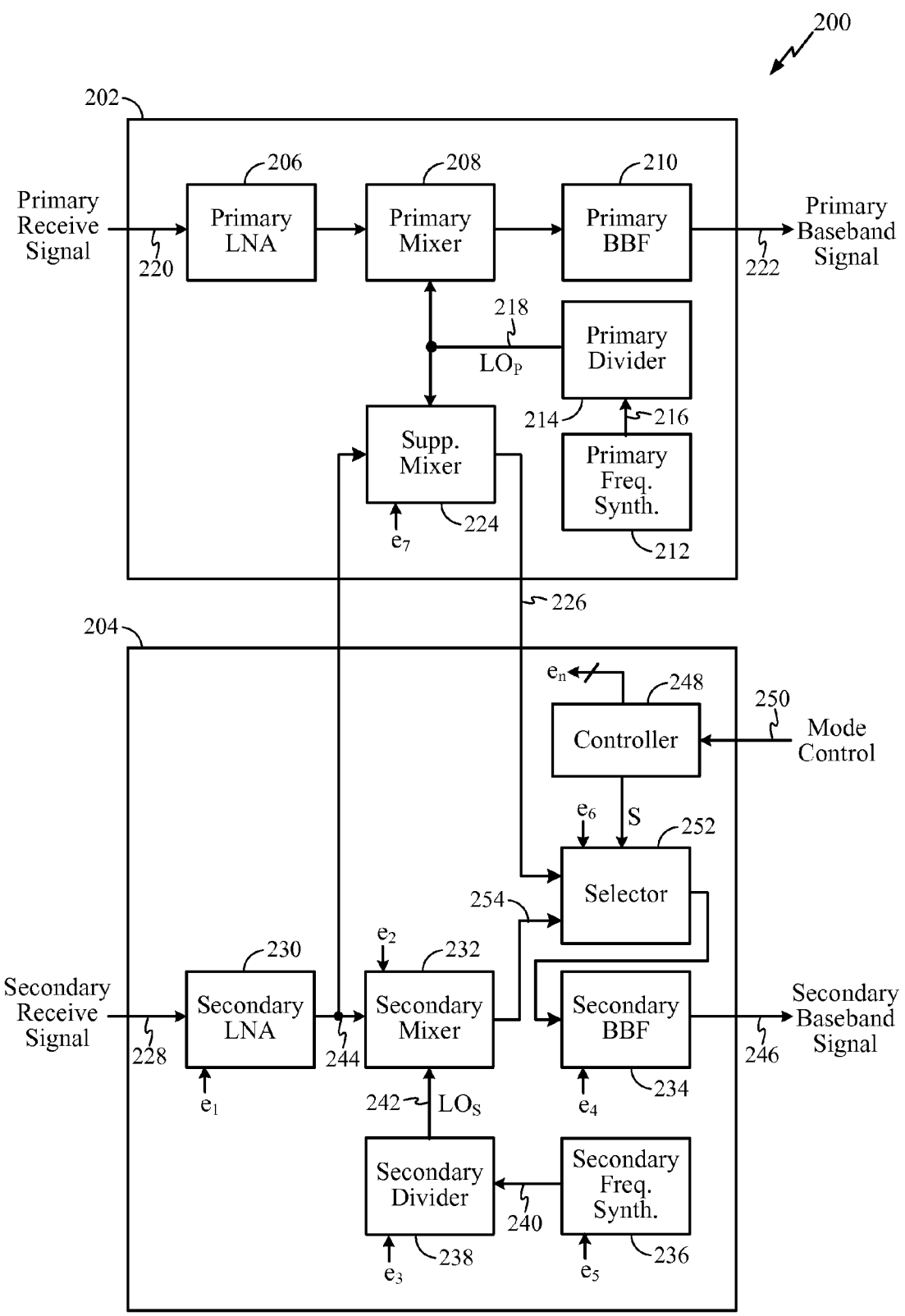
FIG. 2 shows an exemplary detailed embodiment of a novel diversity receiver having a shared primary local oscillator signal for reduced power consumption.

FIG. 2 shows a detailed exemplary embodiment of a novel diversity receiver 200 for use in a wireless device. The receiver 200 comprises a primary receiver 202 to receive a primary signal 220 and a secondary receiver 204 to receive a secondary signal 228. The primary receiver 202 comprises a primary low noise amplifier (LNA) 206, primary mixer 208, primary baseband filter (BBF) 210, primary frequency synthesizer 212 and primary frequency divider 214. During operation, the primary LNA 206 receives the primary receive signal 220 and provides an amplified version of the primary receive signal to the primary mixer 208. The primary frequency synthesizer 212 outputs a primary oscillator signal 216 that is used by the primary divider 214 to generate a primary $LO_P$ signal 218 that is input to the primary mixer 208. The primary mixer 208 down-converts the amplified primary receive signal to generate a primary down-converted signal that is input to the primary BBF 210. The primary BBF 210 filters the down-converted signal to generate a primary baseband (BB) signal 222 that is input to other circuitry at the device, such as a baseband processor.

The secondary receiver 204 comprises a secondary low noise amplifier (LNA) 230, secondary mixer 232, secondary BBF 234, secondary frequency synthesizer 236, and second frequency divider 238. During operation, the secondary LNA 230 receives the secondary receive signal 228 and provides an amplified version of the secondary receive signal to the secondary mixer 232. The secondary frequency synthesizer 236 output a secondary oscillator signal 240 that is used by the secondary divider 238 to generate a secondary $LO_S$ signal 242 that is input to the secondary mixer 232. The secondary mixer 232 down-converts the amplified secondary receive signal to generate a secondary baseband signal 254 that is input to a selector 252. The output of the selector 252 is input to the secondary BBF 234, which filters the down-converted signal to generate a secondary BB signal 246 that is input to other circuitry at the device, such as a baseband processor.

The primary receiver 202 also comprises a supplemental mixer 224. When operating in diversity mode (mode 3 above), the supplemental mixer 224 receives the amplified secondary receive signal 244 and the primary $LO_P$ signal 218 and generates a supplemental secondary baseband signal 226. For example, the primary $LO_P$ signal 218 is shared between the primary 208 and supplemental 224 mixers, and thus the primary divider 216 is shared between the primary 208 and supplemental 224 mixers. The supplemental mixer 224 utilizes the primary $LO_P$ signal 218 to down-convert the amplified secondary receive signal 244 to produce the supplemental secondary baseband signal 226.

The supplemental secondary baseband signal 226 is input to the selector 252 located at the secondary receiver 204. The selector 252 selects either the secondary baseband signal 254 or the supplemental secondary baseband signal 226 as input to the secondary BBF 234 based on a selection signal (S) generated from a controller 248. Thus, the addition of the supplemental mixer 224 allows the use of a short transmission path for the primary $LO_P$ signal 218 when operating in a diversity mode where the primary $LO_P$ signal 218 is used to down-convert the amplified secondary receive signal 244. The short signal path used to provide the $LO_P$ signal 218 to the supplemental mixer 224 results in reduced power consumption in the diversity mode when compared to conventional diversity receivers.

Furthermore, additional power savings are achieved as a result of sharing the primary frequency divider 214 between the primary 202 and secondary receivers 204. For example, in the exemplary receiver 200 the primary divider 214 outputs the shared $LO_P$ signal 218 and therefore the secondary divider 238 and secondary mixer 232 can be placed in a low power standby mode for added power savings.

The controller 248 comprises hardware and/or hardware executing software and is configured to receive a mode control signal 250 from another entity at the device, such as a baseband processor. The controller 248 uses the mode control signal 250 to generate a select signal (S) and enable signals ($e_n$) that are configured to control various functional modules of the diversity receiver 200. For example, a seventh enable signal ($e_7$) enables or disables the supplemental mixer 224. A second enable signal ($e_2$) enables or disables the secondary mixer 232. A fifth enable signal ($e_5$) enables or disables the secondary frequency synthesizer 236. The connection of other enable signals is further illustrated in FIG. 2. The select signal (S) is connected to the selector 252 and controls the selector 252 to select either the supplemental secondary baseband signal 226 from a supplemental mixer 224 or the secondary baseband signal 254 from the secondary mixer 232 as input to the BBF 234.

During operation, the controller 248 determines which modules to enable and disable based on the mode control signal 250. A module that is disabled is either turned off or placed in a low power mode thereby reducing power consumption of the diversity receiver 200. The following enable ($e_n$) and select signal (S) settings are output from the controller 248 in each of the following modes.

1. Single receive mode (Primary receiver 202 only)
   S—set to select either secondary mixer output 254 or supplemental mixer output 226.
   ($e_1$-$e_7$)—set to disable associated functions
2. Carrier Aggregation mode
   S—set to select secondary mixer output 254
   ($e_1$-$e_6$)—set to enable associated functions
   ($e_7$)—set to disable supplemental mixer 224
3. Diversity mode
   S—set to select supplemental mixer output 226
   ($e_1$, $e_4$, $e_6$, $e_7$)—set to enable associated functions
   ($e_2$, $e_3$, $e_5$)—set to disable associated functions Therefore, in various exemplary embodiments, a novel diversity receiver 200 is provided to address the problems of power consumption associated with selected operating modes. In an exemplary embodiment, the diversity receiver 200 comprises the supplemental mixer 224 that is utilized during operation in diversity mode. The supplemental mixer 224 is located close to the primary receiver's frequency divider 214 to share the primary $LO_P$ signal 218 with the primary mixer 208. The close proximity of the supplemental mixer 224 to the primary divider 216 minimizes the transmission path of the primary $LO_P$ signal 218 during diversity mode operation. By reducing the transmission path of the primary $LO_P$ signal 218, substantial power savings can be realized during diversity mode operation. For example, power savings are achieved as a result of sharing the primary divider 214 between the primary 208 and supplemental 224 mixers. Furthermore, the use of the supplemental mixer 224 allows unneeded modules (i.e., secondary divider 238) at the secondary receiver 204 to be powered down to save additional power.

Figure 3:
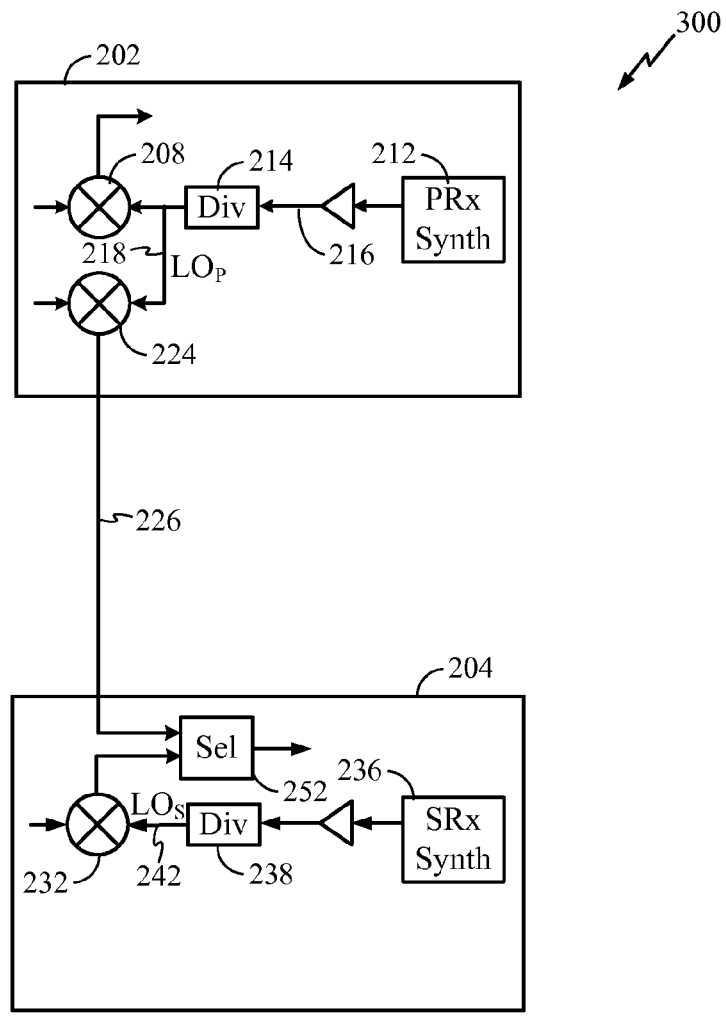
FIG. 3 shows a detailed view of the exemplary diversity receiver shown in FIG. 2.

FIG. 3 shows a detailed view 300 of the novel diversity receiver 200 shown in FIG. 2. The output of the primary frequency synthesizer (PRx Synth) 212 is the primary oscillator signal 216 that is input to the primary frequency divider 214. The output of the primary divider 214 is the $LO_P$ signal 218 that is shared between the primary mixer 208 and the supplemental mixer 224. The output 226 of the supplemental mixer 224 is input to the selector 252. Thus, the shared $LO_P$ signal 218 of the novel diversity receiver 200 provides reduced power consumption over the conventional receivers since this signal travels over a very short signal path. Furthermore, additional power savings are achieved as a result of sharing the primary divider 214 between the primary 208 and supplemental 224 mixers so that the secondary divider 238 can be powered down.

Figure 4:
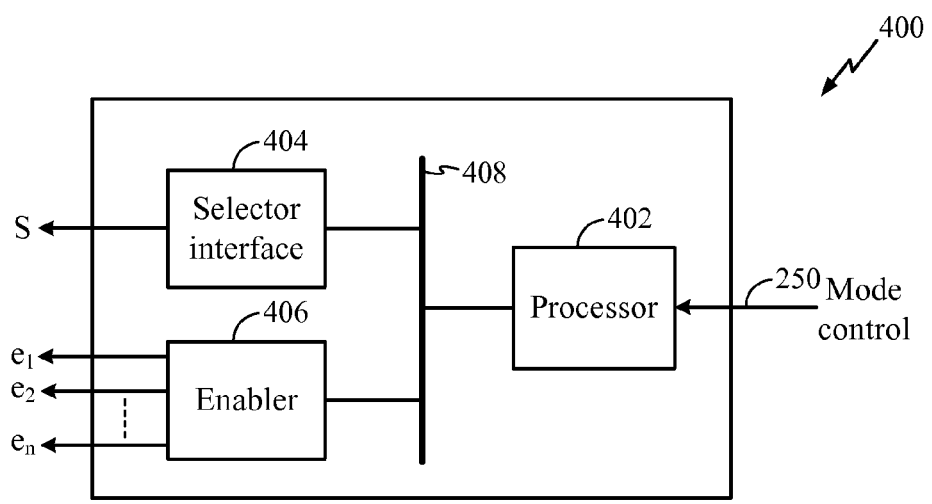
FIG. 4 shows an exemplary embodiment of a controller for use in the exemplary diversity receive shown in FIG. 2.

FIG. 4 shows an exemplary embodiment of a controller 400. For example, the controller 400 is suitable for use as the controller 248 shown in FIG. 2. The controller 400 comprises processor 402, selector interface 404, and enabler 406 all coupled to communicate over bus 408. It should be noted that the controller 400 is just one implementation and that other implementations are possible.

The selector interface 404 comprises hardware and/or hardware executing software that operates to allow the controller 400 to control the operation of the selector 252. For example, the selector interface 404 outputs the selection signal (S) to comprise one or more bits which indicate which input to the selector 252 is to be output to the secondary BBF 234. The selector interface 404 is controlled by communicating with the processor 402 using bus 408.

The enabler 406 comprises hardware and/or hardware executing software that operates to allow the controller 400 to enable selected modules of the diversity receiver 200. For example, the enabler 406 outputs "n" enable signals ($e_1$-$e_n$) which enable or disable corresponding functional modules of the diversity receiver 200. The enabler 406 is controlled by operation of the processor 402 using bus 408.

The processor 402 comprises at least one of a CPU, processor, gate array, hardware logic, memory elements, and/or hardware executing software. The processor 402 operates to control the selector interface 404 and the enabler 406 to perform the functions described herein. For example, the processor 402 comprises an internal memory and executes instructions or codes stored or embodied in the internal memory to perform the functions described herein.

Figure 5:
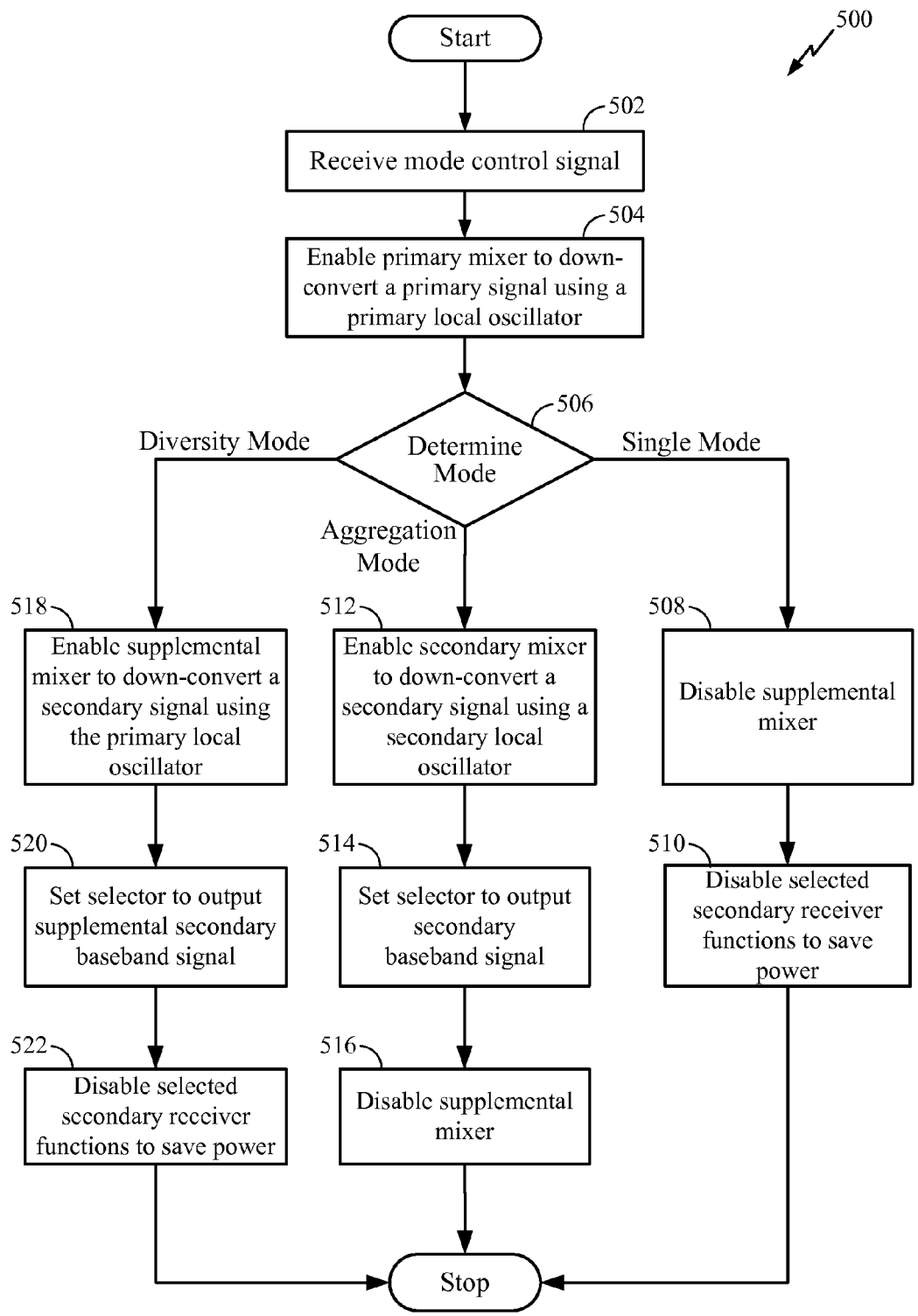
FIG. 5 shows an exemplary method for operating a diversity receiver comprising a shared primary local oscillator signal.

In an exemplary embodiment, the processor 402 receives the mode control signal 250 from a baseband processor or other entity and operates to control the selection interface 404 and enabler 406 based on the mode control signal 250 to generate the selection signal (S) and the enable signals ($e_1$-$e_n$). For example, in an exemplary embodiment, the mode control signal 250 comprises two bits that are set to indicate one of four possible states and each state is associated with an operating mode. For example, the first three states (0, 1, 2) indicate the three modes described above, respectively. The fourth state (3) can be unused or indicate any desired fourth operating mode. In other exemplary embodiments, the mode control signal may have more or less bits to indicate more or less operating modes. In an exemplary embodiment, the mode control signal 250 is generated by a baseband processor at the device, but may also be generated by another controller or processor at the device that desires to set operation of the receiver 200 to a desired operating mode FIG. 5 shows an exemplary method 500 for operating a diversity receiver comprising a shared primary LO signal path in a diversity mode. For example, the method 500 is suitable for use by the receiver 200 shown in FIG. 2 in conjunction with the controller 500 shown in FIG. 5. In an exemplary embodiment, the processor 502 executes one or more sets of codes or instructions stored or embodied in a memory to perform the functions described below.

At block 502, a mode control signal is received. In an exemplary embodiment, the mode control signal 250 is received by the processor 402 of the controller 400. The mode control signal 250 is received from an entity at a device, such as a baseband processor. The mode control signal 250 indicates an operating mode for the diversity receiver 200.

At block 504, a primary mixer is enabled to down-convert a primary receive signal using a primary local oscillator. In an exemplary embodiment, the primary mixer 208 down-converts the primary receive signal 220 using the $LO_P$ signal 218.

At block 506, an operating mode determination is made. For example, the processor 402 processes the mode control signal 250 to determine the operating mode for the diversity receiver 200. A first operating mode is a single receive mode, a second operating mode is a carrier aggregation mode, and a third operating mode is a diversity mode. In an exemplary embodiment, if the mode control signal 250 indicates the single receive mode, the method proceeds to block 508. If the mode control signal 250 indicates the carrier aggregation mode the method proceeds to block 512, and if the mode control signal 250 indicated the diversity mode, the method proceeds to block 518.

Single Receive Mode

If the determination at block 506 is to enable single receive mode the method continues at block 508. At block 508, the supplemental mixer 224 is disabled. In an exemplary embodiment, the processor 402 controls the enabler 406 to output the $e_7$ enable signal to disable the supplemental mixer 224.

At block 510, selected secondary receiver functions are disabled to save power. In an exemplary embodiment, the processor 402 controls the enabler 406 to output the following enable ($e_n$) signals to disable the following functional modules of the receiver 200.

1. $e_1$ set to disable secondary LNA 230
2. $e_2$ set to disable secondary mixer 232
3. $e_3$ set to disable secondary divider 238
4. $e_4$ set to disable secondary BBF 234
5. $e_5$ set to disable secondary frequency synthesizer 236
6. $e_6$ set to disable the selector 252

The above settings enable only the primary receiver 202 to operate in single receive mode. The method 500 then ends.

Carrier Aggregation Mode

If the determination at block 506 is to enable carrier aggregation mode the method continues at block 512. At block 512, the secondary mixer 232 is enabled to down-convert the amplified secondary receive signal 244 using the secondary local oscillator signal $LO_S$ 242. For example, the processor 402 controls the enabler 406 to output the following enable ($e_n$) signals to enable the following functional modules of the receiver 200.

1. $e_1$ set to enable secondary LNA 230
2. $e_2$ set to enable secondary mixer 232
3. $e_3$ set to enable secondary divider 238

4. $e_4$ set to enable secondary BBF 234
5. $e_5$ set to enable secondary frequency synthesizer 236

At block 514, the selector 252 is set to select the secondary baseband signal 254 as input to the secondary BBF 234. For example, the processor 402 controls the selector interface 404 to output the selection signal (S) to control the selector 252 to select the secondary baseband signal 254 as input to the secondary BBF 234. The processor 402 also controls the enabler 406 to output $e_6$ enable signal to enable the selector 252.

At block 516, the supplemental mixer 224 is disabled. In an exemplary embodiment, the processor 402 controls the enabler 406 to set the enable signal $e_7$ to disable the supplemental mixer 224. The method 500 then ends.

Diversity Mode

If the determination at block 506 is to enable diversity mode the method continues at block 518. At block 518, the supplemental mixer 224 is enabled to down-convert the amplified secondary receive signal 244 using the primary local oscillator $LO_P$ 218. For example, the processor 402 controls the enabler 406 to output the $e_7$ enable signal to enable the supplemental mixer 224.

At block 520, the selector 252 is set to select the supplemental secondary baseband signal 226 as input to the secondary BBF 234. For example, the processor 402 controls the selector interface 404 to output the selection signal (S) to control the selector 252 to select the output 226 of the supplemental down-converter 224 as input to the secondary BBF 234. The processor 402 also controls the enabler 406 to output $e_6$ enable signal to enable the selector 252.

At block 522, selected secondary receiver functions are disabled to save power. In an exemplary embodiment, the processor 402 controls the enabler 406 to output the following enable ($e_n$) signals to enable/disable the following functional modules of the receiver 200.

1. $e_1$ set to enable secondary LNA 230
2. $e_2$ set to disable secondary mixer 232
3. $e_3$ set to disable secondary divider 238
4. $e_4$ set to enable secondary BBF 234
5. $e_5$ set to disable secondary frequency synthesizer 236

The above settings enable the primary receiver 202 and the secondary receiver 204 to operate in diversity mode. The method 500 then ends.

Therefore, the method 500 provides operation of a diversity receiver to share the primary $LO_P$ signal 218 when operating in a diversity mode thereby saving power when compared to conventional diversity receivers. It should be noted that the method 500 is just one implementation and that the operations of the method 500 may be rearranged or otherwise modified such that other implementations are possible.

Figure 6:
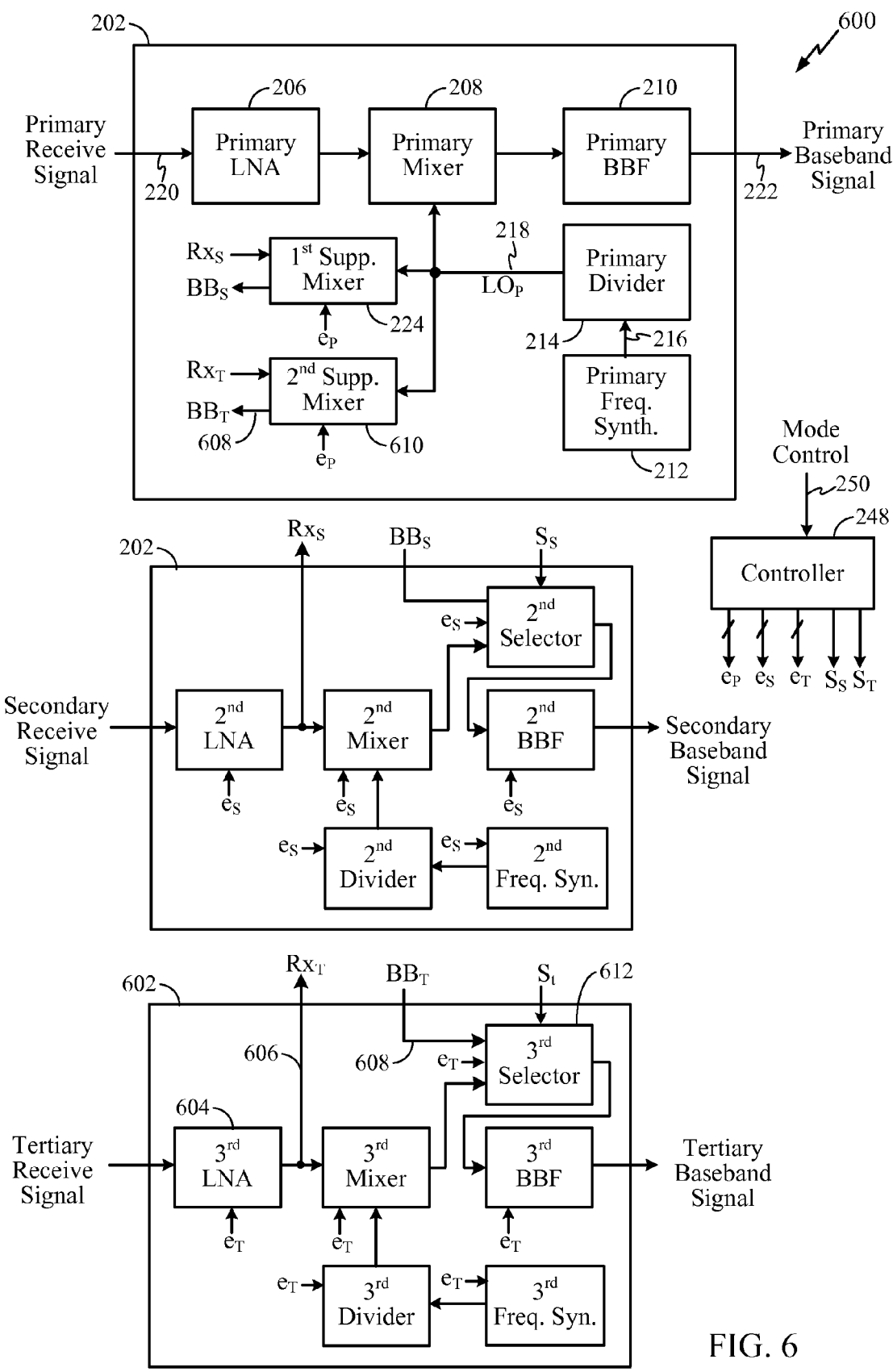
FIG. 6 shows an exemplary embodiment of a novel diversity receiver having secondary and tertiary receivers that shared a primary local oscillator signal for reduced power consumption.

FIG. 6 shows an exemplary embodiment of a novel diversity receiver 600 having secondary 202 and tertiary 602 receivers that share a primary oscillator signal for reduced power consumption. The receiver 600 illustrates how the diversity receiver 200 shown in FIG. 2 can be expanded to include a plurality of additional receivers that are configured to share the primary $LO_P$ signal 218.

The tertiary receiver 602 is configured similarly to the secondary receiver 202. Thus, tertiary receiver 602 operates to receive a tertiary receive signal and amplify this signal using an LNA 604. The LNA 604 outputs an amplified tertiary receive signal $Rx_T$ 606 that is input to a second supplemental mixer 610 located at the primary receiver 202. The second supplemental mixer 610 is configured to share the primary $LO_P$ signal 218 with the primary mixer 208 and the first supplemental mixer 224. The second supplemental mixer 610 receives the amplified tertiary receive signal $Rx_T$ 606 and down-converts this signal using the shared primary $LO_P$ signal 218 to generate a tertiary BB signal ($BB_T$) 608. The $BB_T$ signal 608 is input to a tertiary selector 612.

The controller 248 is configured to output a selector signal $S_S$ to the secondary receiver 204 and to output selector signal $S_T$ to the tertiary receiver 602. The controller 248 is also configured to output enable signals $e_P$, $e_S$, and $e_T$, which are used to enable and disable various functional modules of each receiver depending of the state of the mode signal 250 to reduce power consumption. For clarity, the connections of the $e_P$, $e_S$, and $e_T$ signals to each receiver are shown generally, however, the connections are in accordance with previously described embodiments shown above.

During operation, the controller 248 determines a particular operating mode from the mode signal 250, and based on this mode the secondary 204 and tertiary 602 receivers are configured for operation by the controller 248 using the enable and selection signals. For example, the controller 248 outputs the enable signals $e_P$, $e_S$, and $e_T$ and the selection signals $S_S$ and $S_T$ in accordance with the selected operating mode. For example, in an exemplary embodiment, the diversity mode describe with respect to the method 600 shown in FIG. 6 can be modified to utilize the tertiary receiver 602 instead of the secondary receiver 204. In this configuration, the functional modules of the secondary receiver may be disabled to save power.

In an exemplary embodiment, the receiver 600 comprising one or more receivers (i.e., similar to receiver 602) having one or more additional mixers and configured to down-convert one or more additional received signals, respectively. The primary receiver is further configured to have one or more additional supplemental mixers (i.e., similar to mixer 610) configured to down-convert the one or more additional received signals, respectively, the primary mixer and the one or more additional supplemental mixers configured to share the primary local oscillator (LO) signal (i.e., $LO_P$ 218). The controller is further configured to disable selected additional mixers and to enable corresponding selected additional supplemental mixers to down-convert selected additional received signals based on a selected operating mode determined from the mode control signal 250.

Thus, as illustrated by FIG. 6, the diversity receiver 200 can be expanded to include any number of additional receivers and these receivers can share the primary $LO_P$ 218 to reduce power consumption.

Figure 7:
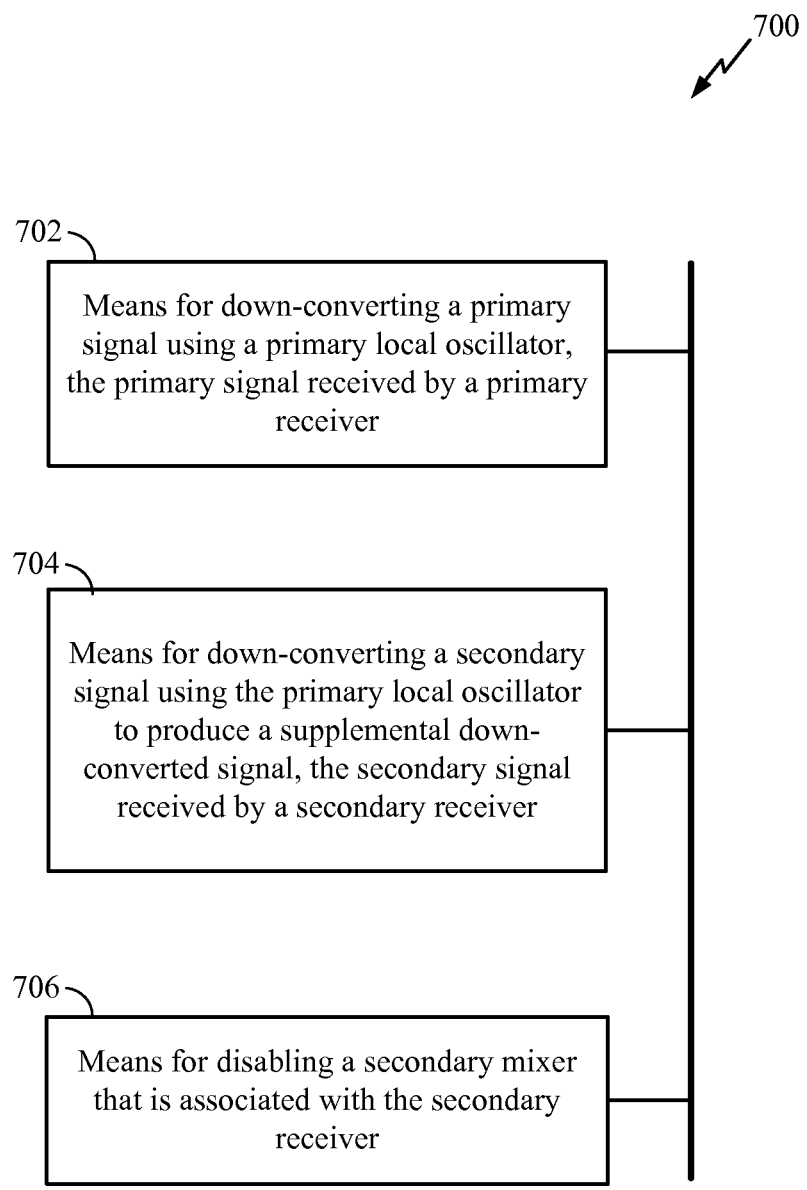
FIG. 7 shows an exemplary embodiment of a diversity receiver apparatus.

FIG. 7 shows an exemplary embodiment of a diversity receiver apparatus 700. For example, the apparatus 700 is suitable for use as the diversity receiver 200 shown in FIG. 2. In an aspect, the apparatus 700 is implemented by one or more modules configured to provide the functions as described herein. For example, in an aspect, each module comprises hardware and/or hardware executing software.

The apparatus 700 comprises a first module comprising means (702) for down-converting a primary signal using a primary local oscillator, the primary signal received by a primary receiver, which in an aspect comprises the primary mixer 208.

The apparatus 700 also comprises a second module comprising means (704) for down-converting a secondary signal using the primary local oscillator to produce a supplemental down-converted signal, the secondary signal received by a secondary receiver, which in an aspect comprises the supplemental mixer 224.

The apparatus 700 also comprises a third module comprising means (706) for disabling a secondary mixer that is associated with the secondary receiver, which in an aspect comprises the controller 248.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
   a primary receiver having a primary mixer configured to down-convert a primary signal and a supplemental mixer configured to down-convert a secondary signal, wherein the primary mixer and the supplemental mixer share a primary local oscillator (LO) signal;
   a secondary receiver having a secondary mixer configured to down-convert the secondary signal;
   a controller configured to enable the supplemental mixer to down-convert the secondary signal when operating in a diversity mode; and
   a selector having inputs configured to receive a supplemental baseband signal from the supplemental mixer and a secondary baseband signal from the secondary mixer, the selector configured to couple one of its inputs to a secondary baseband filter (BBF) based on a select signal from the controller.

2. The apparatus of claim 1, the controller configured to disable the supplemental mixer and to enable the secondary mixer to down-convert the secondary signal when operating in a carrier aggregation mode.

3. The apparatus of claim 1, the controller configured to disable the supplemental mixer and the secondary mixer when operating in a single receiver mode.

4. The apparatus of claim 1, the selector configured to couple the supplemental baseband signal to the secondary BBF when operating in the diversity mode.

5. The apparatus of claim 1, the selector configured to couple the secondary baseband signal to the secondary BBF when operating in a carrier aggregation mode.

6. The apparatus of claim 1, the primary receiver comprising a shared primary frequency synthesizer that is coupled to the primary mixer and supplemental mixer.

7. An apparatus comprising:
   a primary receiver having a primary mixer configured to down-convert a primary signal and a supplemental mixer configured to down-convert a secondary signal, wherein the primary mixer and the supplemental mixer share a primary local oscillator (LO) signal;
   a secondary receiver having a secondary mixer configured to down-convert the secondary signal;
   a controller configured to enable the supplemental mixer to down-convert the secondary signal when operating in a diversity mode; and
   one or more additional receivers having one or more additional mixers, configured to down-convert one or more additional received signals, respectively;
   the primary receiver further configured to have one or more additional supplemental mixers configured to down-convert the one or more additional received signals, respectively, wherein the primary mixer and the one or more additional supplemental mixers are configured to share the primary local oscillator (LO) signal; and
   the controller further configured to enable corresponding selected additional supplemental mixers to down-convert selected additional received signals based on a selected operating mode.

* * * * *